(12) United States Patent
Kasai

(10) Patent No.: US 11,125,813 B2
(45) Date of Patent: Sep. 21, 2021

(54) PROBER

(71) Applicant: TOKYO ELECTRON LIMITED, Tokyo (JP)

(72) Inventor: Shigeru Kasai, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/767,226

(22) PCT Filed: Nov. 5, 2018

(86) PCT No.: PCT/JP2018/041002
§ 371 (c)(1),
(2) Date: May 27, 2020

(87) PCT Pub. No.: WO2019/107079
PCT Pub. Date: Jun. 6, 2019

(65) Prior Publication Data
US 2021/0033666 A1 Feb. 4, 2021

(30) Foreign Application Priority Data

Dec. 1, 2017 (JP) .............................. JP2017-232009

(51) Int. Cl.
*G01R 31/28* (2006.01)
*H05B 45/40* (2020.01)
*G01R 31/26* (2020.01)

(52) U.S. Cl.
CPC ......... *G01R 31/2886* (2013.01); *G01R 31/26* (2013.01); *G01R 31/2863* (2013.01);
(Continued)

(58) Field of Classification Search
CPC ........................ G01R 1/0491; G01R 31/265; G01R 31/3012; G01R 31/318511
See application file for complete search history.

(56) References Cited

U.S. PATENT DOCUMENTS

2004/0122605 A1* 6/2004 Miyazaki ................ H01L 22/20
702/57
2008/0284455 A1* 11/2008 Obikane ............ G01R 31/2893
324/754.08

FOREIGN PATENT DOCUMENTS

JP 07-297242 A 11/1995
JP 2004-140296 A 5/2004
(Continued)

OTHER PUBLICATIONS

International Search Report dated Jan. 29, 2019 for WO 2019/107079 A1 (4 pages).

*Primary Examiner* — Tung X Nguyen
(74) *Attorney, Agent, or Firm* — Abelman, Frayne & Schwab

(57) ABSTRACT

A prober includes: a stage that places a substrate formed with a plurality of chips thereon in a matrix; a contact that sequentially contacts with electrode pads of the plurality of chips thereby performing an inspection on electrical characteristic of the plurality of chips; a plurality of LED units provided on a side opposite to a placing surface of the stage so as to independently heat a plurality of areas where the plurality of chips are located, respectively, and each including one or a plurality of LEDs; and a controller that outputs a control signal to drive, among the plurality of LED units, at least an LED unit corresponding to an area of a chip to be inspected, among the area of the chip to be inspected and peripheral areas of the corresponding area.

8 Claims, 15 Drawing Sheets

(52) U.S. Cl.
CPC ..... *G01R 31/2875* (2013.01); *G01R 31/2877* (2013.01); *H05B 45/40* (2020.01)

(56) References Cited

FOREIGN PATENT DOCUMENTS

| | | | |
|---|---|---|---|
| JP | 2013-065823 | A | 4/2013 |
| JP | 2014-209556 | A | 11/2014 |
| JP | 2015-056624 | A | 3/2015 |

* cited by examiner

PROBER

CROSS REFERENCE TO RELATED APPLICATIONS

This application is a national phase of PCT application No. PCT/JP2018/041002, filed on 5 Nov. 2018, which claims priority from Japanese Patent Application No. 2017-232009, filed on 1 Dec. 2017, all of which are incorporated herein by reference.

TECHNICAL FIELD

The present disclosure relates to a prober configured to test electrical characteristics of test target devices arranged in a matrix.

BACKGROUND

In a semiconductor device manufacturing processing, for example, as disclosed in Patent Document 1, IC chips such as integrated circuits (IC) are formed in a matrix on a surface of a semiconductor wafer (hereinafter, referred to as a "wafer") serving as a substrate. Thereafter, a probe test that applies a voltage to the chip to inspect electrical characteristics is performed in a state of the wafer before the IC chip is separated.

The IC chips which have passed the probe test are packaged, and then, a final test is performed on each package, but packaging is costly. As a result, it is required to find a defective IC chip by performing a test with as high accuracy as possible in the probe test in a step before performing packaging. In recent years, a test for electrical characteristics is performed in the probe test by applying a voltage at the time of mounting in a state where a test target chip is exposed to a temperature of the mounting environment. At this time, the temperature of the wafer on which the test target chip is formed is controlled by a coolant flowing path or a heater provided inside a stage. However, it is difficult to reduce the size of the coolant flowing path or the heater, and the temperature of a plurality of IC chips formed on the wafer on the stage is adjusted as a whole by adjusting the temperature of the entire surface of the stage.

In recent years, since the speed and the miniaturization of an IC are advanced and degree of integration has been increased, the amount of heat generated during the operation of an IC has increased. As a result, in the probe test, when applying the voltage same as a voltage applied at the time of mounting to the test target chip, the amount of heat generated from the test target chip increases. Therefore, it may cause a problem in that, for example, when performing a probe test in a high-temperature environment, IC chips, on which the test is not performed, around the test target chip are also exposed to a thermal load caused by the temperature rise by the heater and the heat generated by the test of the test target chip. Therefore, it is necessary to apply a lower voltage in the probe test than the mounting voltage applied to the test target chip when the test target chip is mounted in order to suppress the heat, and as a result, defects in the IC chip may not be found sufficiently before packaging, which is problematic.

PRIOR ART DOCUMENT

Patent Document

Patent Document 1: Japanese Patent Laid-Open Publication No. 07-297242

SUMMARY OF THE INVENTION

Problem to be Solved

The present disclosure is made under such circumstances, and is to provide a technology that, when performing a probe test sequentially on test target chips arranged in a matrix on a substrate on a stage, reduces a thermal load on test target chips other than the test target chips to be tested.

Means to Solve the Problem

A prober according to the present disclosure is configured to sequentially test electrical characteristics of a plurality of test target chips provided in a matrix on a substrate by a tester, and includes:
a stage configured to place the substrate thereon;
a contact configured to sequentially contact with electrode pads of the plurality of test target chips;
a plurality of LED units provided on a side opposite to a placing surface of the stage so as to independently heat a plurality of areas where the plurality of test target chips are located, respectively, and each including one or a plurality of LEDs; and
a controller configured to, when testing the test target chips, output a control signal to drive, among the plurality of LED units, an LED unit corresponding to an area of a test target chip on which the test is performed, among the area of the test target chip on which the test is performed and peripheral areas of the corresponding area.

Effect of the Invention

In the present disclosure, when sequentially testing electrical characteristics of a plurality of test target chips arranged in a matrix by the tester, a plurality of LED units is provided on the side opposite to the placing surface of the stage that places thereon the substrate on which the test target chips are arranged so as to independently heat the test target chips, respectively. Then, when testing the test target chips, among a test target chip on which the test is performed and peripheral areas of the area, at least an area corresponding to the test target chip on which the test is performed is heated. As a result, it is possible to reduce the thermal load on test target chips other than the test target chip on which the test is performed.

DETAILED DESCRIPTION TO EXECUTE THE INVENTION

First Embodiment

Figure 1:
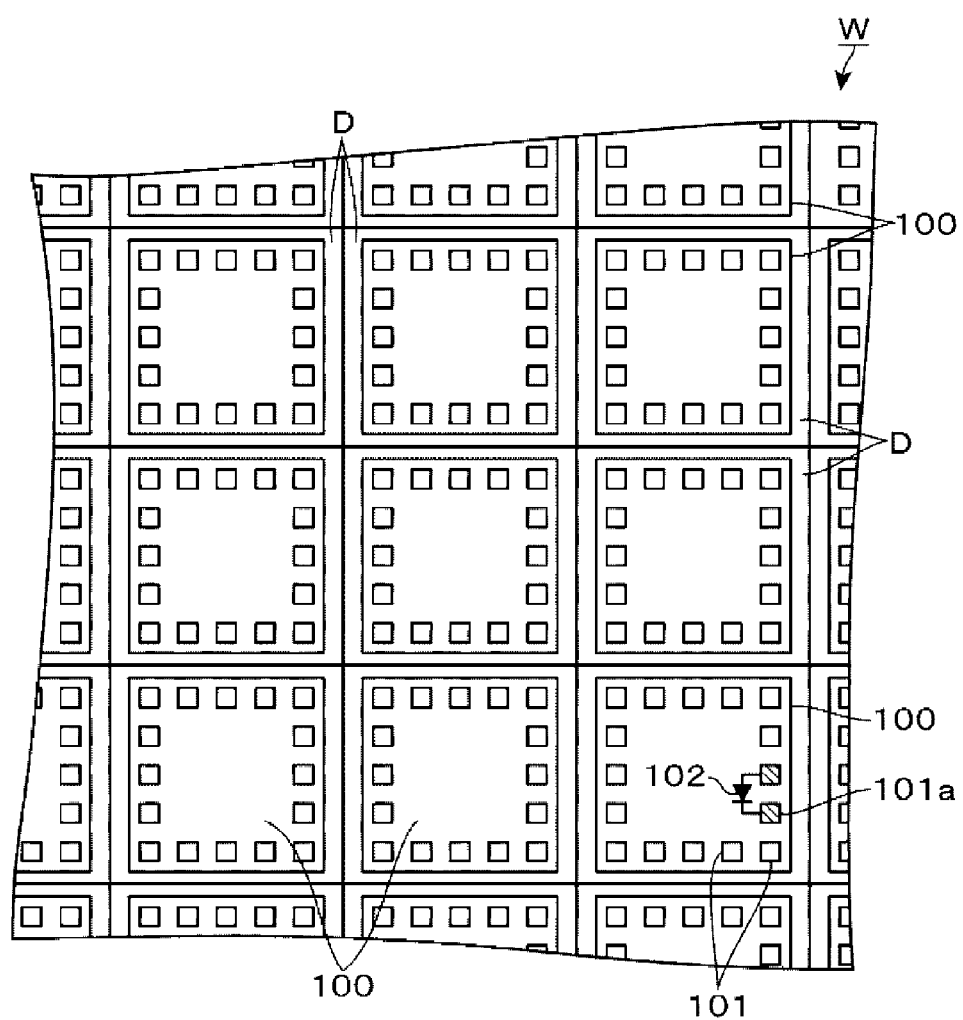
FIG. 1 is a plan view illustrating an IC chip, which is a test target, formed on a wafer.

Descriptions will be made on a prober according to a first embodiment, and first, a wafer W on which a test target chip is formed will be described. The wafer W is configured as, for example, a disc shape having a diameter of 300 mm. As illustrated in FIG. 1, an area of a surface of the wafer W, which is inside a 5-mm cut line from a peripheral portion is partitioned into a grid pattern in which, for example, areas D of squares 30 mm on a side are spread, and a rectangular IC chip 100 having, for example, an IC on the surface is formed in each area D. Electrode pads 101 are formed in each IC chip 100 to supply a current to an element that constitutes the IC chip 100, and in the prober, a voltage at the time of mounting is applied to the electrode pads 101 to test electrical characteristics. Further, a part of electro pads 101a in the IC chip 100 is connected to a temperature measuring element 102 used to measure the temperature of, for example, a diode. Then, when measuring the temperature of the test target chip 100 (to be described later), the electro pad 101a connected to the temperature measuring element 102 is used. In the following specification, an IC chip that is a test target and an IC chip that is not a test target are referred to as a "test target chip 100" without distinction.

Figure 2:
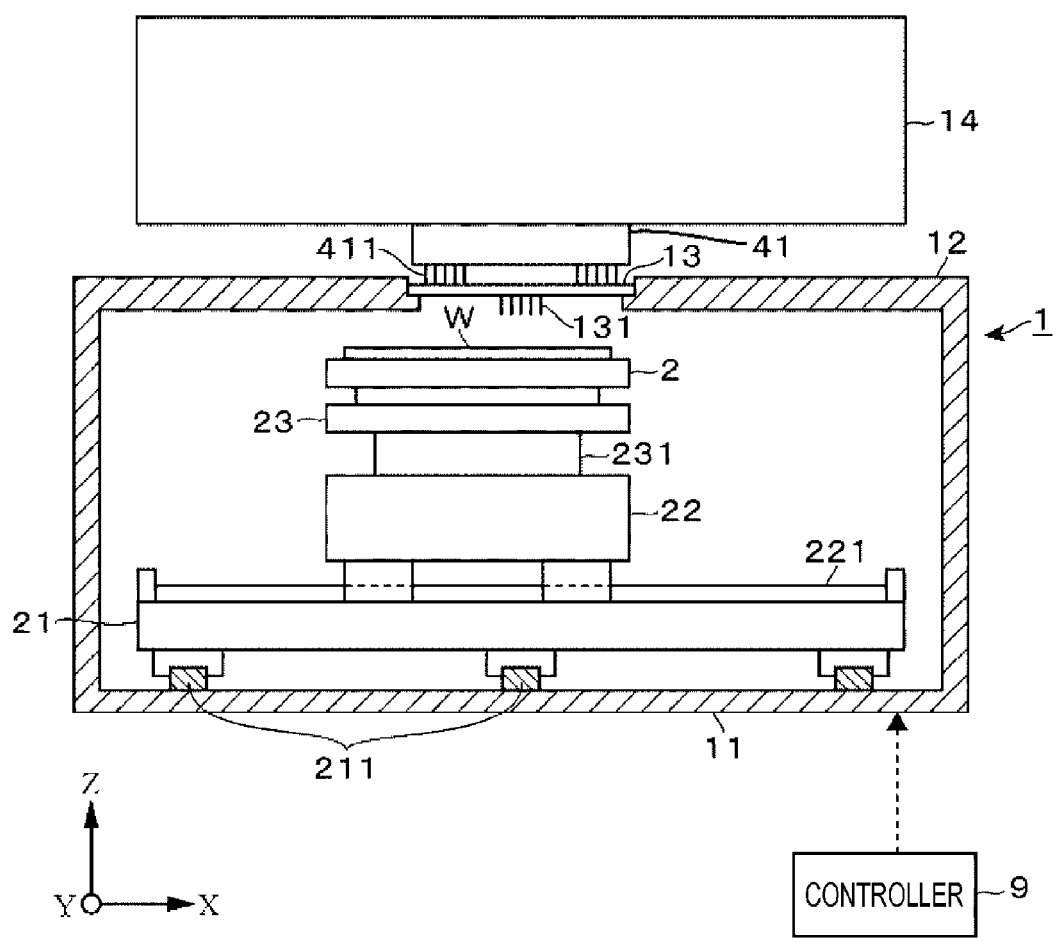
FIG. 2 is a longitudinal sectional side view of a prober according to a first embodiment.

Next, descriptions will be made on an entire configuration of the prober. As illustrated in FIG. 2, the prober includes a case 1 that constitutes a device body. A Y stage 21 configured to movable along a Y rail 211 extending in a Y direction (a direction intersecting with FIG. 2) is provided on a base 11 at the bottom of the case 1. Further, an X stage 22 configured to movable along an X rail 221 extending in an X direction (a left and right direction in FIG. 2) is provided on the Y stage 21.

For example, a ball screw mechanism (not illustrated) is provided alongside the Y stage 21 and the X stage 22, and the rotation amount of the ball screw may be adjusted using a motor combined with an encoder. With this configuration, a stop position of the Y stage 21 in the Y direction and a stop position of the X stage 22 in the X direction may be accurately adjusted.

A Z moving portion 23 configured to be supported by a telescopic shaft 231 configured to be extendable and retractable, and be movable up and down in a Z direction (a vertical direction) is provided on the X stage 22. Further, a stage 2 configured to be rotatable (movable in a θdirection) around a Z axis on the Z moving portion 23 is provided on an upper surface side of the Z moving portion 23. The above-described Y stage 21, X stage 22, and Z moving portion 23 supported by the telescopic shaft 231 constitute a moving mechanism of the embodiment, and the stage 2 may be moved in each of the X, Y, Z, and θdirections.

An area in which the stage 2 (the wafer W placed on the placing surface) is moved by the Y stage 21, the X stage 22, and the Z moving portion 23 is referred to as a "moving area," and a probe card 13 is provided above the moving area. The probe card 13 is detachably attached to a top plate 12 of the case 1.

The probe card 13 is configured as a printed circuit board (PCB), and an electrode group is formed on an upper surface side thereof. Further, an interface 41 is interposed between a tester 14 disposed above the top plate 12 and the probe card 13 so as to establish electrical conductivity between a terminal on the tester 14 side and the electrode group already described.

The interface 41 is configured as a pogo pin unit in which a plurality of pogo pins 411 serving as electrode portions is disposed so as to correspond to the disposed position of the electrode group of the probe cards 13, and the interface 41 is fixed, for example, on the tester 14 side.

Further, the tester 14 includes a data storage unit (not illustrated) that stores an electrical signal indicating the electrical characteristics of the test target chip acquired via the probe card 13 as test data, or a determination unit (not illustrated) that determines the presence or absence of electrical defects of the test target chip 100 based on the test data. A plurality of probe needles 131 serving as a probe electrically connected to the electrode group on the upper surface side, respectively, is provided on a lower surface side of the probe card 13.

Figure 3:
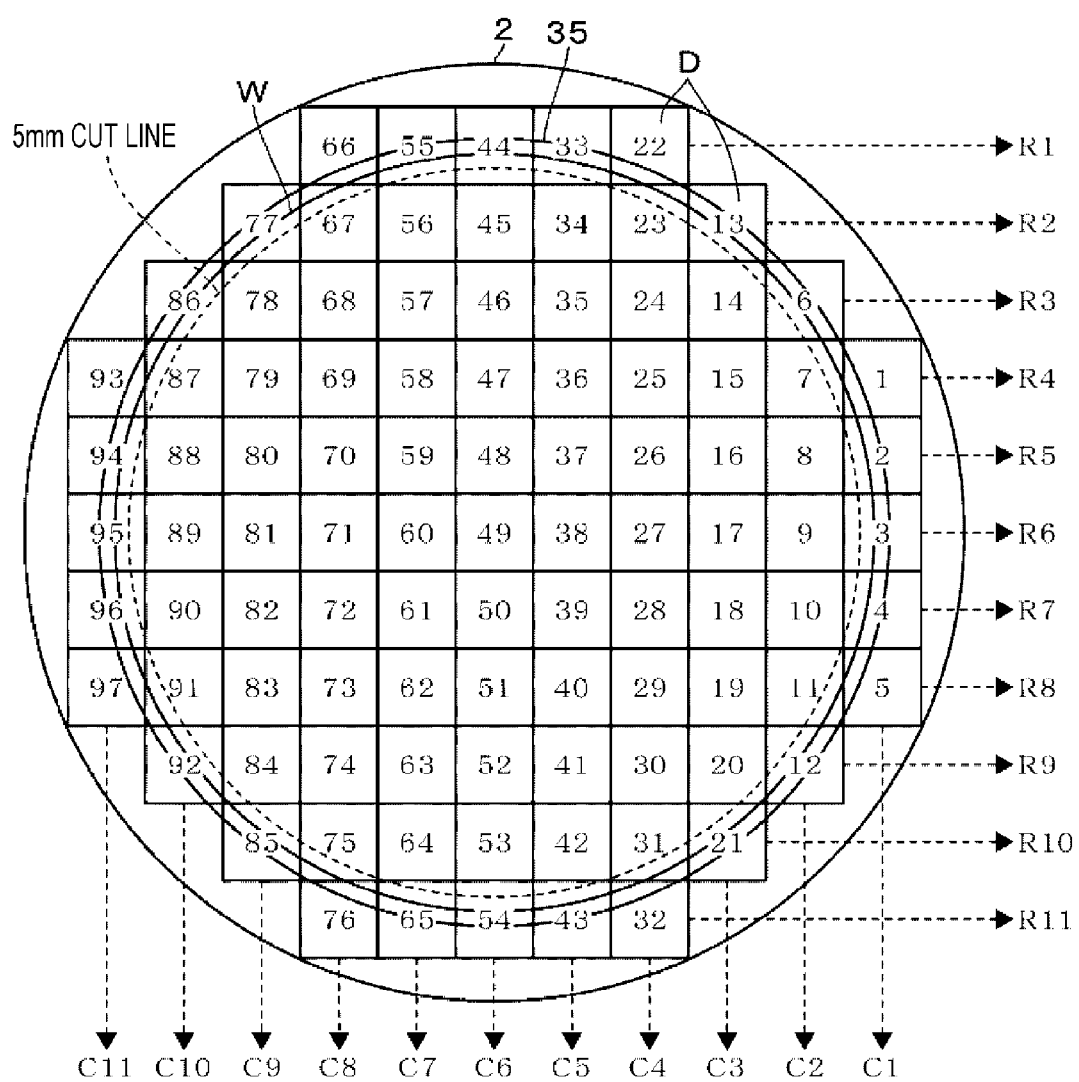
FIG. 3 is a plan view of a stage used in the prober.

Next, descriptions will be made on the stage 2. As illustrated in FIG. 3, the area D of the stage 2 extending over an area in which the wafer is placed is partitioned into a grid pattern, and is divided into 97 rectangular areas D of 11 columns (columns C1 to C11) and 11 rows (rows R1 to R11) each having 30 mm square. Hereinafter, in the specification, each area D will be described with a number given to each area in FIG. 3.

Figure 4:
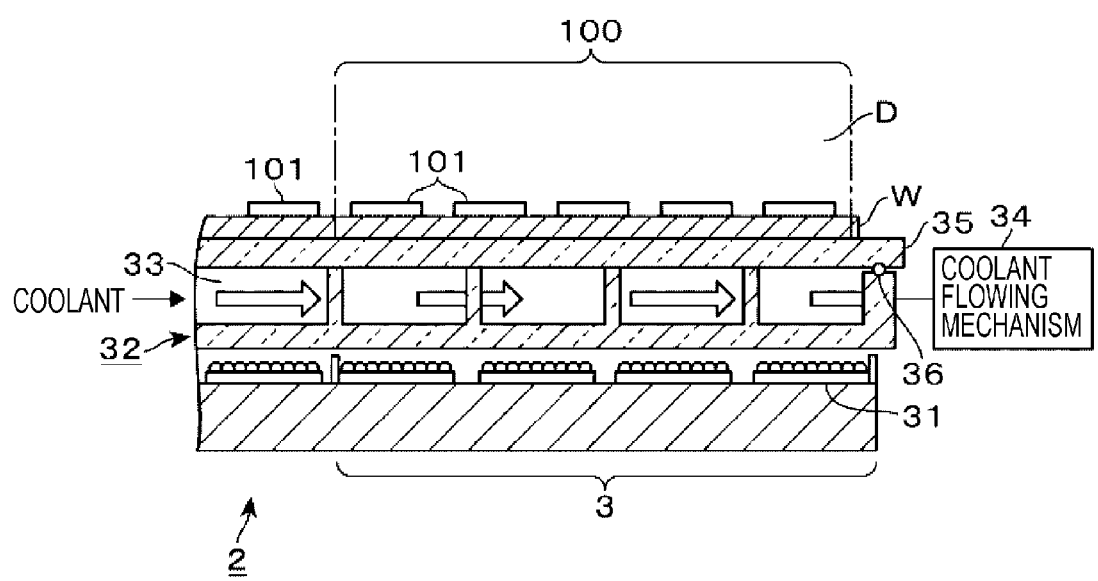
FIG. 4 is a longitudinal sectional view of a surface portion of the stage.

As illustrated in FIG. 4, in the stage 2, the LED unit 3 that irradiates light from a side opposite to the surface on which the wafer W is placed toward the low surface of the wafer W placed on the placing surface is provided individually for each area D. The LED unit 3 is configured by, for example, arranging a plurality of LED light sources 31, and is configured to be capable of irradiating light to the entire area of the area D of the lower surface of the wafer W placed on the corresponding area D. The LED unit 3 may be configured by one LED light source 31.

A cooling unit 32 is provided above the group of the LED units 3 in the stage 2. The cooling unit 32 is made of, for example, a member such as quartz that transmits LED light while hardly attenuating, and has a coolant flowing path 33 common to all the areas D formed therein. The coolant flowing path 33 is connected to a coolant flowing mechanism 34 including a cooling mechanism constituted by, for example, a pump, a flow rate adjuster, and a Peltier effect device. Then, the wafer placed on the placing surface may be cooled by flowing a coolant such as water or Galden (a registered trademark) at a predetermined flow rate through the coolant flowing path 33.

A placing plate 35 that constitutes the placing surface is provided above the cooling unit 32 via an O-ring 36. As illustrated in FIG. 3, the placing plate 35 is configured as, for example, a disc shape having a diameter of 310 mm, which is larger than the wafer W, and is made of a material, for example, quartz that transmits LED light.

Figure 5:
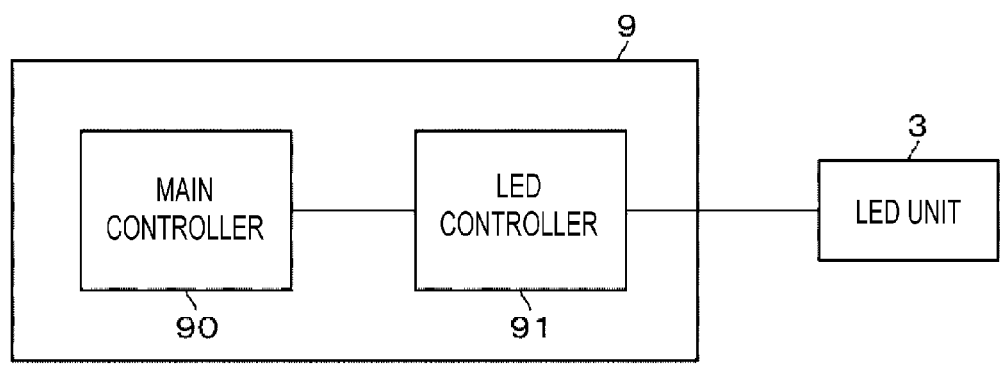
FIG. 5 is a configuration view illustrating a controller of the prober.

Further, the prober includes a controller 9 configured to control the operation of the prober. As illustrated in FIG. 5, the controller 9 includes an LED controller 91 that controls turning ON of the LED unit 3, and a main controller 90 that controls, for example, the movement of the stage 2 or an operation in which a probe needle is pushed onto the test target chip 100 to perform the test. Therefore, information, for example, indicating the area where the test target chip 100 on which the test is performed is placed is sent from the main controller 90 to the LED controller 91.

Figure 6:
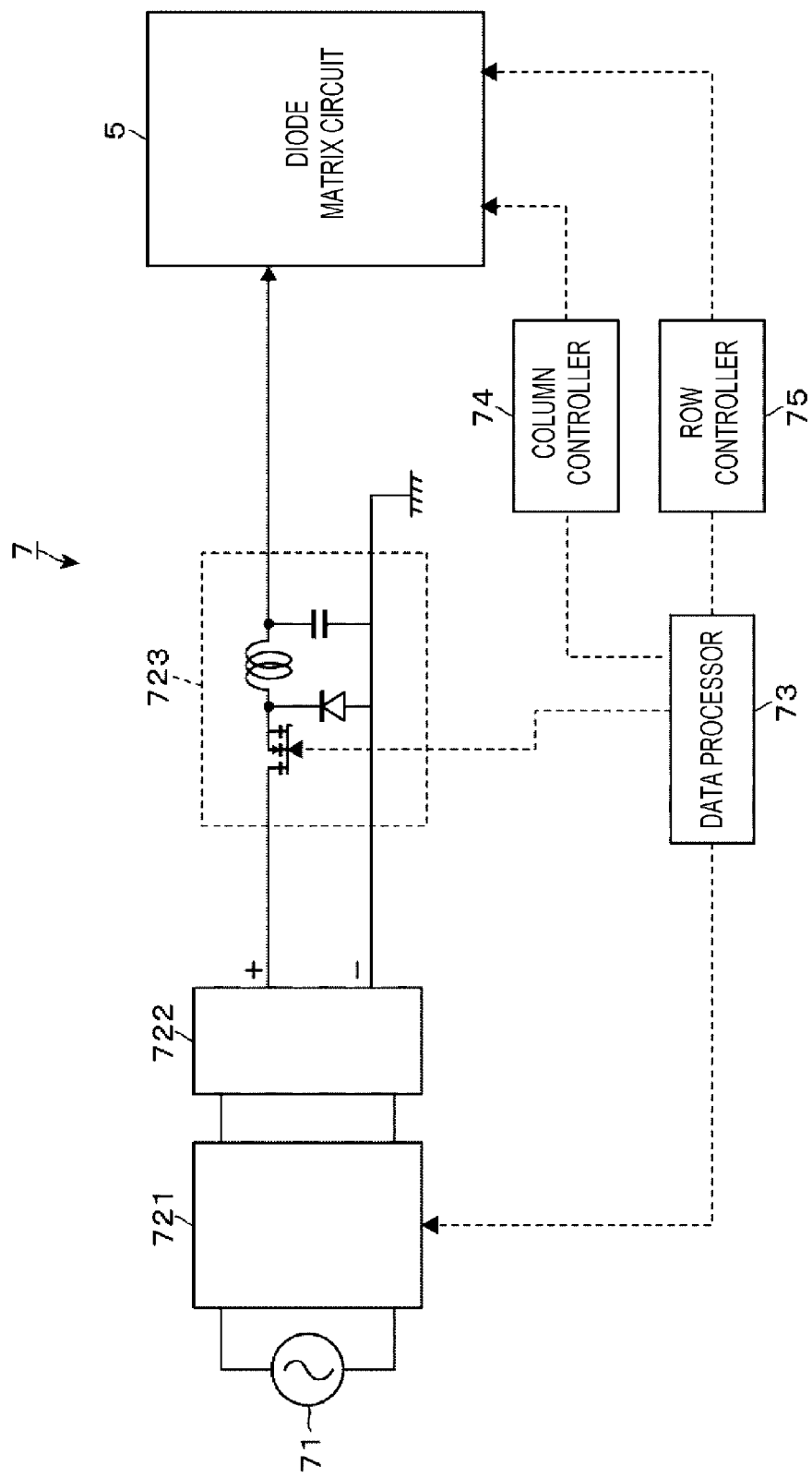
FIG. 6 is a circuit diagram illustrating a circuit configured to individually turn on LED units.

Next, descriptions will be made on a circuit configured to individually turn on the LED unit 3 for each area D. As illustrated in FIG. 6, the control circuit includes, for example, a diode matrix circuit 5 including LED units 3 arranged vertically and horizontally, and a power supply 7 that supplies power to the diode matrix circuit 5. Further, the control circuit includes a column controller 74 and a row controller 75 for selecting the LED unit 3 to be turned on in the diode matrix circuit 5. Further, a reference numeral 73 in FIG. 6 denotes a data processor (controller) including a one-chip CPU that outputs a control signal for controlling the power supply 7, the column controller 74, and the row controller 75. In the example, a section of the data processor 73, the column controller 74, the row controller 75, and a driving circuit of the diode matrix circuit 5 corresponds to the LED controller 91.

As illustrated in FIG. 6, the power supply 7 includes an AC power source 71, a power factor improving circuit 721 that improves a power factor of a radio-frequency power supplied to the load side, a rectifying and smoothing circuit 722 that obtains a DC power from an AC power, and a dropping chopper circuit 723 that adjusts the voltage of the DC power.

The AC power source 71 supplies an AC power of 50/60 Hz and 200 V, using, for example, a commercial AC power source. For example, a DC power of 400 V is output from the rectifying and smoothing circuit 722 provided in combination with, for example, a well-known interleave current continuous mode type power factor improving circuit 721.

The dropping chopper circuit 723 adjusts the DC current supplied from the rectifying and smoothing circuit 722 to a DC power having a voltage in a range of, for example, 10 V to 400 V. Duty control of an active filter in the power factor improving circuit 721, and PWM control of the dropping chopper circuit 723 are controlled by the data processor 73.

Next, descriptions will be made on the diode matrix circuit 5. The test target chip 100 provided on the substrate is provided in each arrangement area where four corner sections out of the matrix arrangement area of 11 rows and 11 columns are lost in a so-called stepped manner. Each LED unit 3 is provided in a matrix of 11 rows and 11 columns corresponding to the arrangement of the test target chip 100. Each LED unit 3 is also provided such that four corner sections out of the matrix arrangement area of 11 rows and 11 columns are lost in the same manner.

Figure 7:
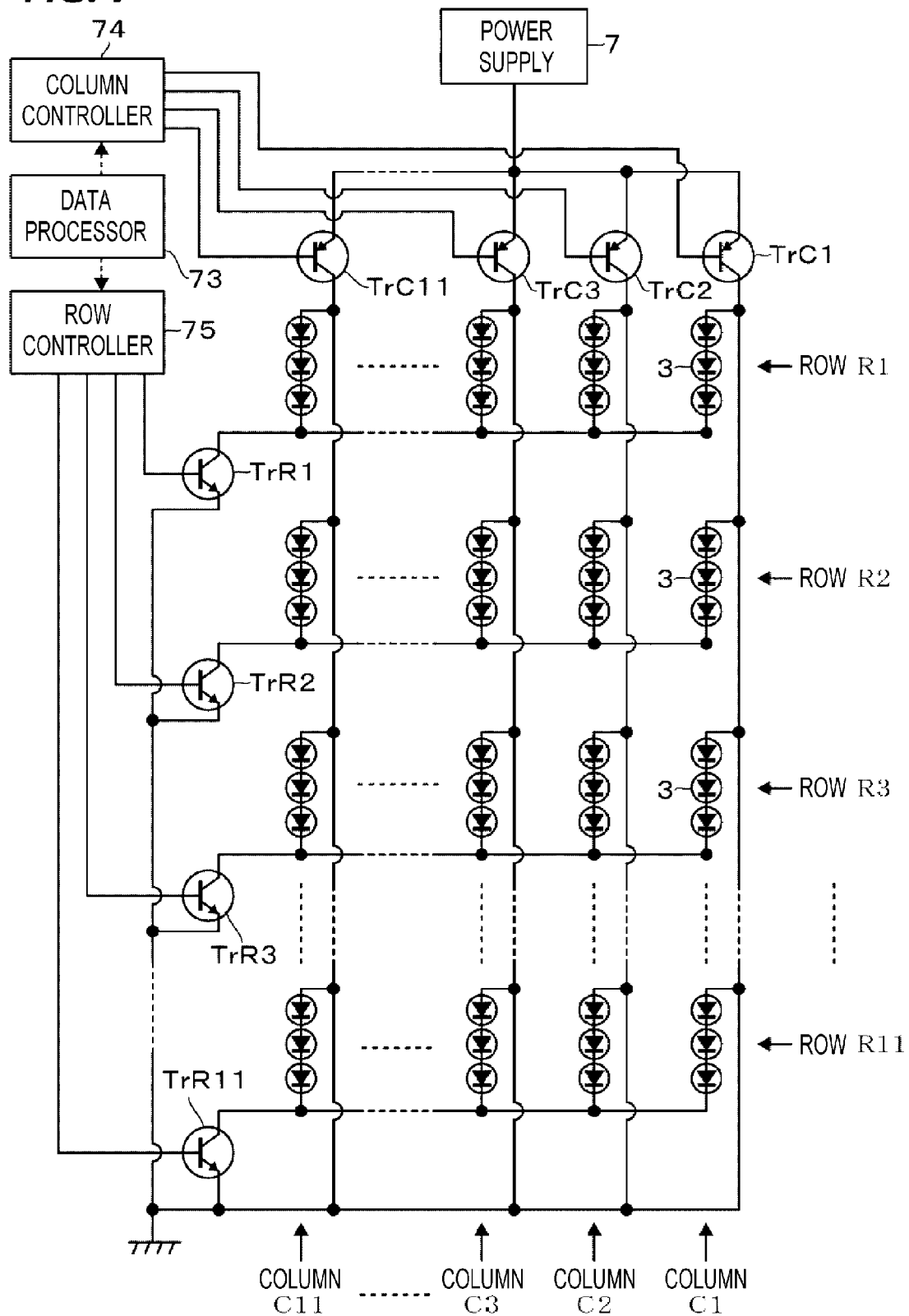
FIG. 7 is a circuit diagram illustrating a diode matrix circuit.

The diode matrix circuit 5 is constituted by the LED units 3 arranged as described above and a driving circuit (a driver) that drives each of the LED units 3. In the diode matrix circuit 5 illustrated in FIG. 7, for convenience of drawing a circuit diagram, the LED unit 3 is also illustrated for the above-mentioned lost arrangement area of the matrix arrangement area. However, the LED unit is not provided in the lost arrangement area.

The driving circuit includes a transistor serving as a row switching unit provided in each row and a transistor serving as a column switching unit provided in each column.

The transistors in each of the rows are assigned reference numerals TrR1, TrR2, . . . , and TrRn corresponding to the first row, the second row, . . . , and the nth row, respectively, and the transistors in each of the columns are assigned reference numerals TrC1, TrC2, . . . , TrCn corresponding to the first column, the second column, . . . , and the nth column, respectively. In the following, the reference numerals (numerical values) at the end of the transistor are denoted in the description of individual transistors, but in the general description of the transistor, the transistor is denoted as TrR or TrC without a reference numeral at the end.

A cathode side of the LED unit 3 in each row is connected to a collector of the corresponding transistor TrR, and an emitter of each transistor TrR is grounded. A base of each transistor TrR is configured to be supplied with a driving voltage by the row controller 75, and each transistor TrR to be turned on is selected by the row controller 75.

An anode side of the LED unit 3 in each column is connected to a collector of the corresponding transistor TrC, and an emitter of each transistor TrC is connected to the power supply 7. A base of each transistor TrC is configured to be supplied with a driving voltage by the column controller 74, and each transistor TrC to be turned on is selected by the column controller 74.

A memory (not illustrated) is provided in the data processor 73 illustrated in FIG. 6. In the memory, the number of the test target chip 100 (area) on which the test is performed and a digital code corresponding to the transistors TrR and TrC for driving the LED units 3 to be driven (turned on) are stored in association with each other. Therefore, when the number of the test target chip 100 that is a test target is designated by the main controller 90, the data processor 73 reads the above-described digital code corresponding to the test target chip 100 from the memory, and outputs to the row controller 75 and the column controller 74. Therefore, a selection signal (a driving signal) is output from the row controller 75 and the column controller 74 to the transistors TrR and TrC, respectively, and the LED unit 3 corresponding to the test target chip 100 is driven.

Figure 8:
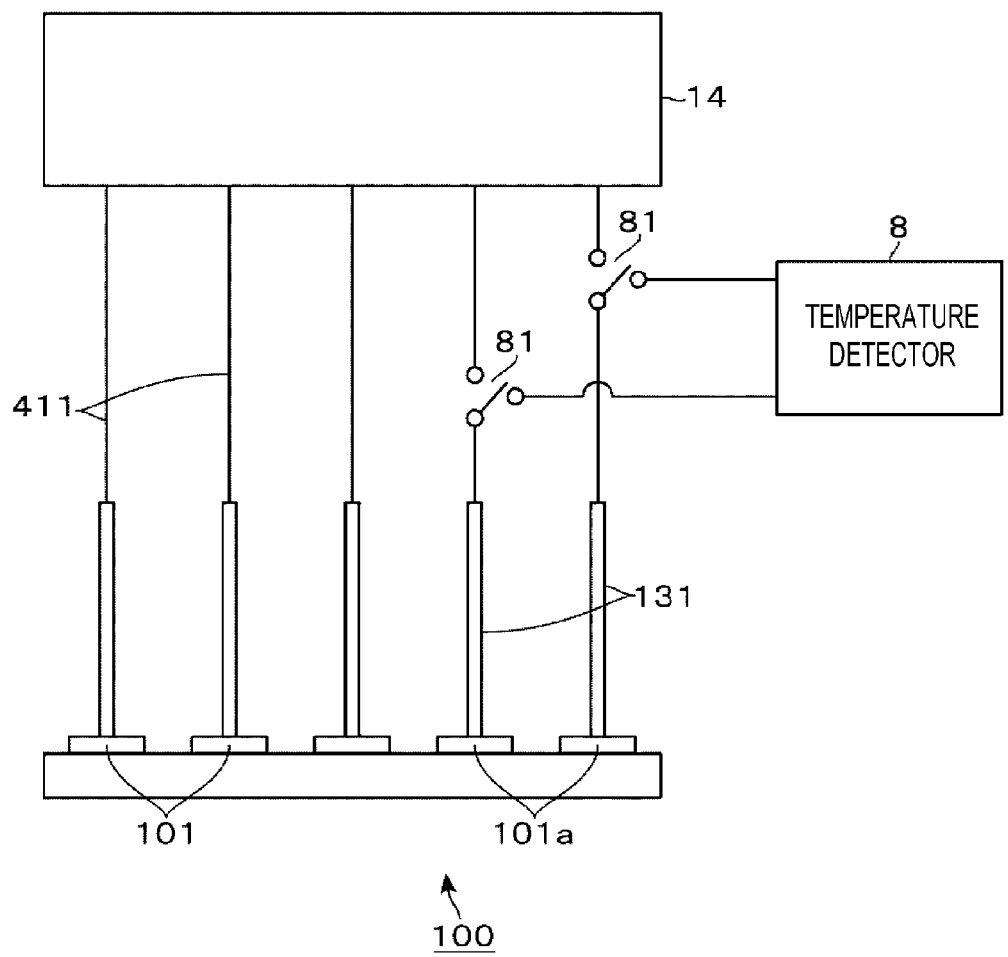
FIG. 8 is a schematic configuration view illustrating a temperature detector.

Further, the prober includes a temperature detector configured to measure the temperature of the test target chip 100. For example, as illustrated in FIG. 8, a relay 81 is respectively provided in the pogo pin 411 serving as an intermediate connection unit electrically connected to two probe needles 131 of the probe needles 131 that are in contact with the electrode pad 101*a* connected to the temperature measuring element 102 of the test target chip 100. Each relay 81 is configured to switch and transmit the potential of the electrode pad 101*a* side to the tester 14 and the temperature detector 8 side. Therefore, for example, when performing the test for the electrical characteristics of the test target chip 100, the potential of each electrode pad 101*a* is transmitted to the temperature detector 8 at a predetermined timing.

At this time, the temperature measuring element 102 such as a diode generates a potential difference according to a predetermined voltage applied to each electrode pad 101. The potential difference differs depending on the temperature. Therefore, it is possible to measure the temperature of the temperature measuring element 102 based on the potential difference between the electrode pads 101*a* corresponding to each electrode of the temperature measuring element 102. Further, since the temperature of the temperature measuring element 102 is substantially equal to the temperature of the test target chip 100, the potential difference may be considered as a value corresponding to the temperature of the test target chip 100. Then, in the prober, feedback is performed based on the temperature detected by the temperature detector 8, and the PWM control of the dropping chopper circuit 723 is performed. Therefore, the output of the power supply 7 is adjusted, and the light emission intensity of the LED unit 3 is controlled.

Figure 9:
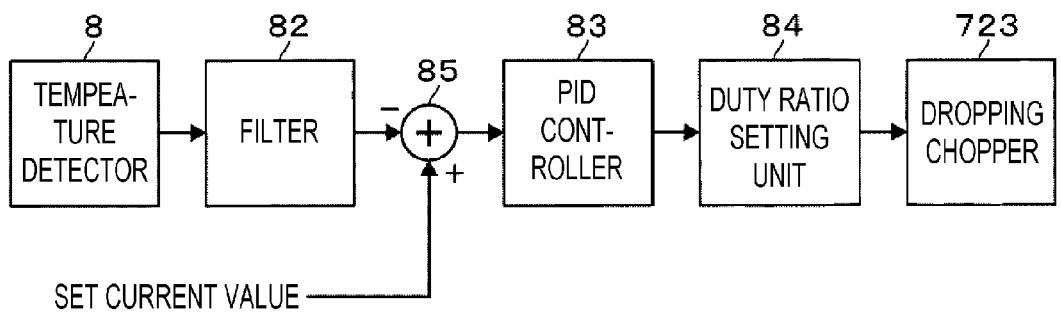
FIG. 9 is an explanatory view illustrating a temperature control circuit.

FIG. 9 illustrates a control circuit that performs the feedback according to the detected temperature, performs the PWM control of the dropping chopper circuit 723, and controls the output of the power supply 7. In the above-described temperature detector 8, a constant current source is calibrated such that a constant continuous current flows, and the diode voltage at this time corresponds to the temperature. The voltage is acquired by, for example, a voltage sensor. After the voltage value corresponding to the temperature information value has passed a filter 82, the deviation value from the set current value corresponding to the set temperature is calculated in an adding unit 85. Then, the deviation value is input to a PID controller 83, and the PID control is performed according to the deviation value, and a duty ratio of the chopper operation in the dropping chopper circuit 723 is adjusted via a duty ratio setting unit 84 according to the operation amount output. Therefore, from the dropping chopper circuit 723, the voltage input to the diode matrix circuit 5 is adjusted, the light emission intensity of the LED unit 3 in the area D selected by the diode matrix circuit 5, and the heating temperature of the corresponding area D is adjusted. The filter 82, the adding unit 85, the PID controller 83, and the duty ratio setting unit 84 are provided, for example, in the data processor 73.

Further, the main controller 90 illustrated in FIG. 5 includes, for example, a program, a memory, a data processor including a CPU, and a group of steps for sending control signals from the controller 90 to the respective components of the probe device so as to perform the test operation on the wafer W is built in the program. The program is stored in a computer storage medium, for example, a storage medium such as a flexible disk, a compact disk, a hard disk, or a magneto-optical disk (MO), and installed to the controller 91.

Next, descriptions will be made on the operation of the above-described prober. First, the wafer W is carried into the case 1 by an external transfer arm (not illustrated), and is placed on the stage 2. At this time, each area D of the wafer W on which each test target chip 100 is formed is placed to be aligned with each area D on the stage 2 side.

Thereafter, the stage 2 is raised, and the probe needle 131 is brought into contact with the electrode pad 101 of the test target chip 100, for example, on the area D49 on the wafer W. At this time, in the stage 2, a coolant flows through the coolant flowing path 33. Further, a driving power corresponding to the temperature set value is provided from the power supply 7 to the diode matrix circuit 5. Further, positional information of the area in which the test target chip 100 is placed is sent from the main controller 90 to the data processor 73. Further, a control signal for turning on the LED unit 3 in the position corresponding to the test target chip to be first tested is output from the data processor 73 to the column controller 74 and the row controller 75.

Figure 10:
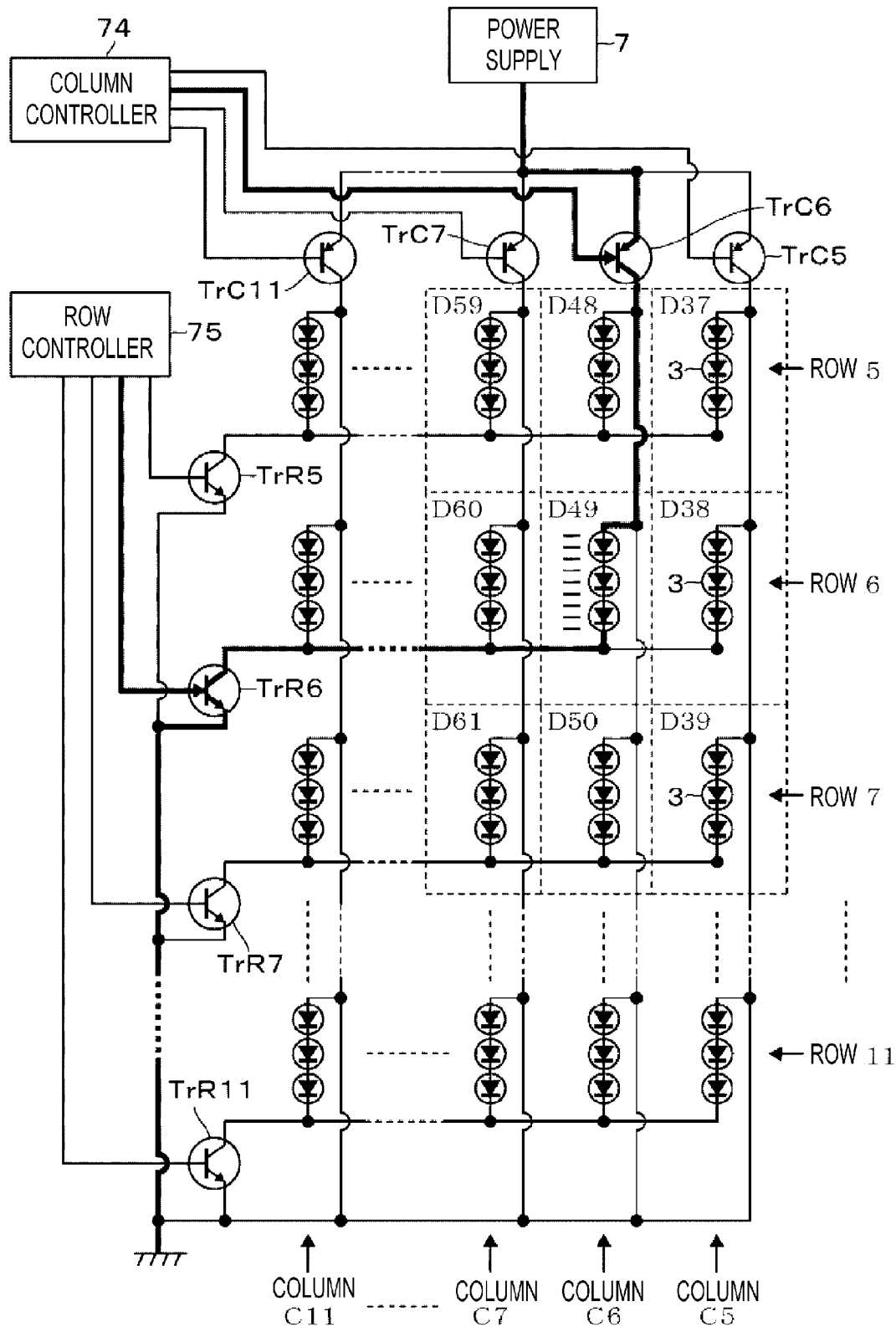
FIG. 10 is an explanatory view illustrating an operation of the first embodiment.

For example, assuming that the LED unit 3 in the area D49 is first turned on, as illustrated in FIG. 10, a voltage of 1 V is applied from the column controller 74 to the transistor TrC6, for example, for 10 milliseconds. Further, at the same time, a voltage of 1 V is applied from the row controller 75 toward the transistor TrR6, for example, 10 milliseconds.

Therefore, the transistor TrC6 and the transistor TrR6 are turned on, and thus, the LED unit 3 in the area D49 corresponding to the column C6 and the row R6 is turned on.

Since the driving current of the LED unit 3 is controlled in voltage via the PWM control by the data processor 73 as described above, the LED unit 3 corresponding to the area D49 is turned on, and heats the area D49 to a set temperature, for example, 85° C. At this time, the areas D other than the area D49 are cooled by a coolant.

Further, while heating the test target chip at the position of the area D49, the test for electrical characteristics is performed by, for example, supplying an electrical signal to the test target chip 100 at the position of the area D49 from the tester 14 via the interface 41, the probe card 13, and the probe needle 131. At this time, the voltage at the time of mounting is applied to the test target chip 100 at the position of the area D49, and heat is generated. At this time, feedback control is performed based on the temperature detected by the temperature detector 8, and the driving power supplied from the power supply 7 is adjusted, so that the temperature of the area D49 is controlled to be, for example, 85° C., including the thermal load due to the heat generation.

Further, the thermal load due to the heat generation of the test target chip 100 is applied to the areas D other than the area D49. However, since the LED units 3 are not turned on, the temperature of the areas D does not increase, and further, the areas D are cooled by the coolant, and thus, are cooled quickly. Therefore, the thermal load corresponding to the temperature of the area D49 is not applied to the test target chips 100 placed in the areas D other than the area D49.

Subsequently, the stage 2 (the wafer W) is sequentially moved with respect to the probe card 13 using the moving mechanism, and subsequently, the probe needle 131 is moved above the test target chip 100 on which the test is performed, for example, the test target chip 100 at the position of the area D50. Further, the probe needle 131 is brought into contact with the electrode pad 101 of the test target chip 100 at the position of the area D50.

Figure 11:
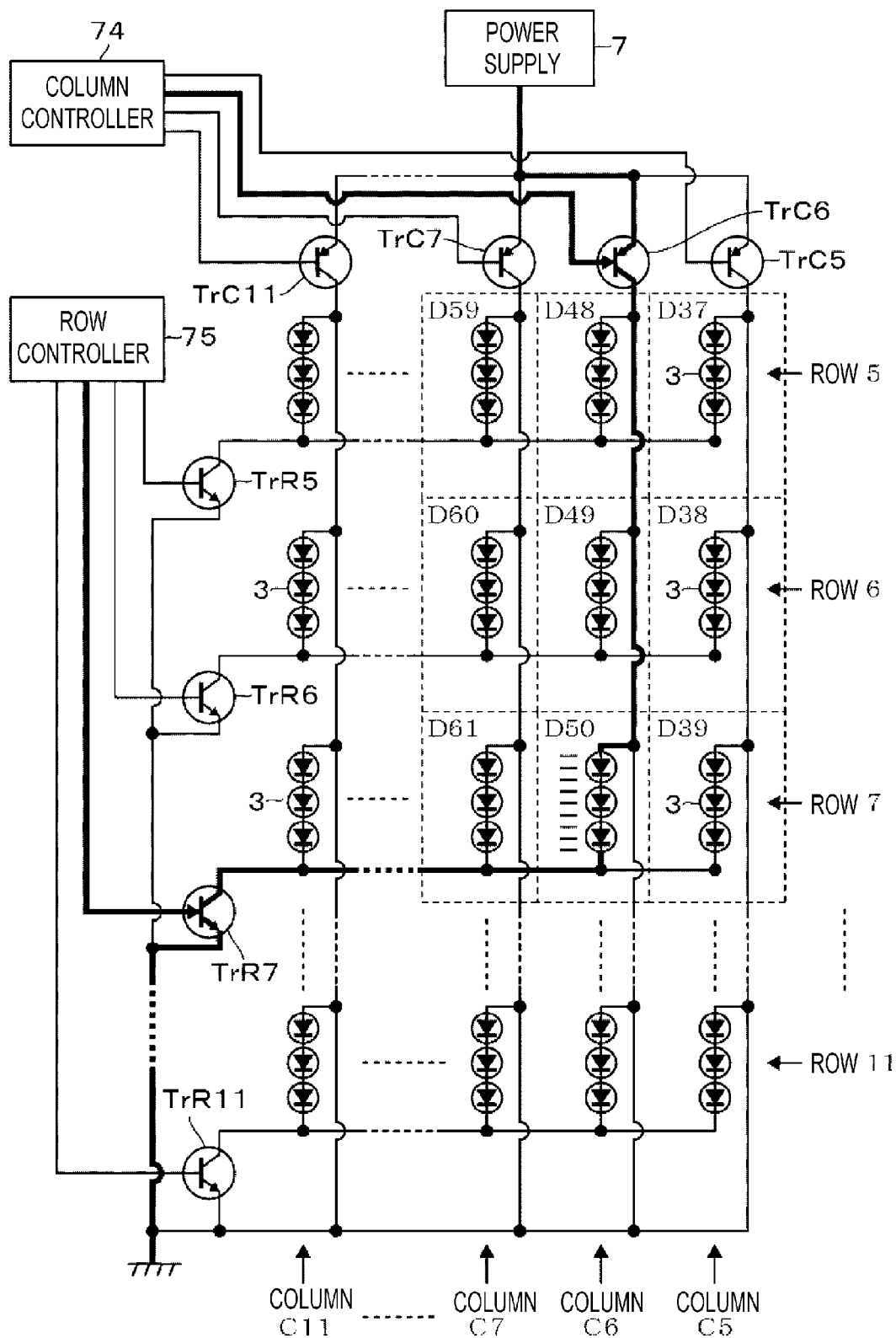
FIG. 11 is an explanatory view illustrating an operation of the first embodiment.

At this time, as illustrated in FIG. 11, the LED unit 30 corresponding to the area 50 is turned on by applying the driving current from the column controller 74 and the row controller 75 to the transistors TrR7 and TrC6, respectively, that is, selecting the transistors TrR7 and TrC6. Therefore, the area D50 is heated to the set temperature. Meanwhile, the LED unit 3 corresponding to the area D49 is turned off, and the area D49 is cooled by the coolant. Then, while heating the area D50, the test for electrical characteristics is performed by supplying an electrical signal to the test target chip 100 at the position of the area D50 from the tester 14 via the probe needle 131.

As described above, the test is sequentially performed by repeating the same operation on the electrode pad 101 of each of the plurality of test target chips 100 formed on the wafer W, and the LED unit 3 irradiating light is sequentially changed, so that the test target chip 100 that is a test target is sequentially controlled.

According to the above-described embodiment, when testing the plurality of test target chips 100 arranged in a matrix, the LED unit 3 is provided on the side of the stage 2 opposite to the placing surface of the test target chip 100 so as to independently heat the area D set for the test target chip 100, respectively. Then, when testing the test target chip 100, the area D corresponding to the test target chip 100 on which the test is performed is sorely heated. As a result, it is possible to reduce the thermal load on the test target chips 100 other than the test target chip 100 on which the test is performed.

Further, when individually turning on each LED unit 3, the diode matrix circuit 5 as illustrated in FIG. 6 is configured to select a transistor for a column unit and a row unit, respectively, and thus, the LED unit 3 to be turned on is selected. As a result, it is not necessary to provide an individual circuit such as a driver circuit for turning on the LED unit 3 for each LED unit 3, and thus, the circuit may be miniaturized, and the device may be miniaturized.

Further, when testing a plurality of test target chips 100 at the same time, it may be controlled that the LED unit 3 in the area corresponding to the area D of the test target chip 100 on which the test is performed is driven, among the area D in which the test target chip 100 is placed, respectively, and the peripheral areas D of the area D.

Figure 12:
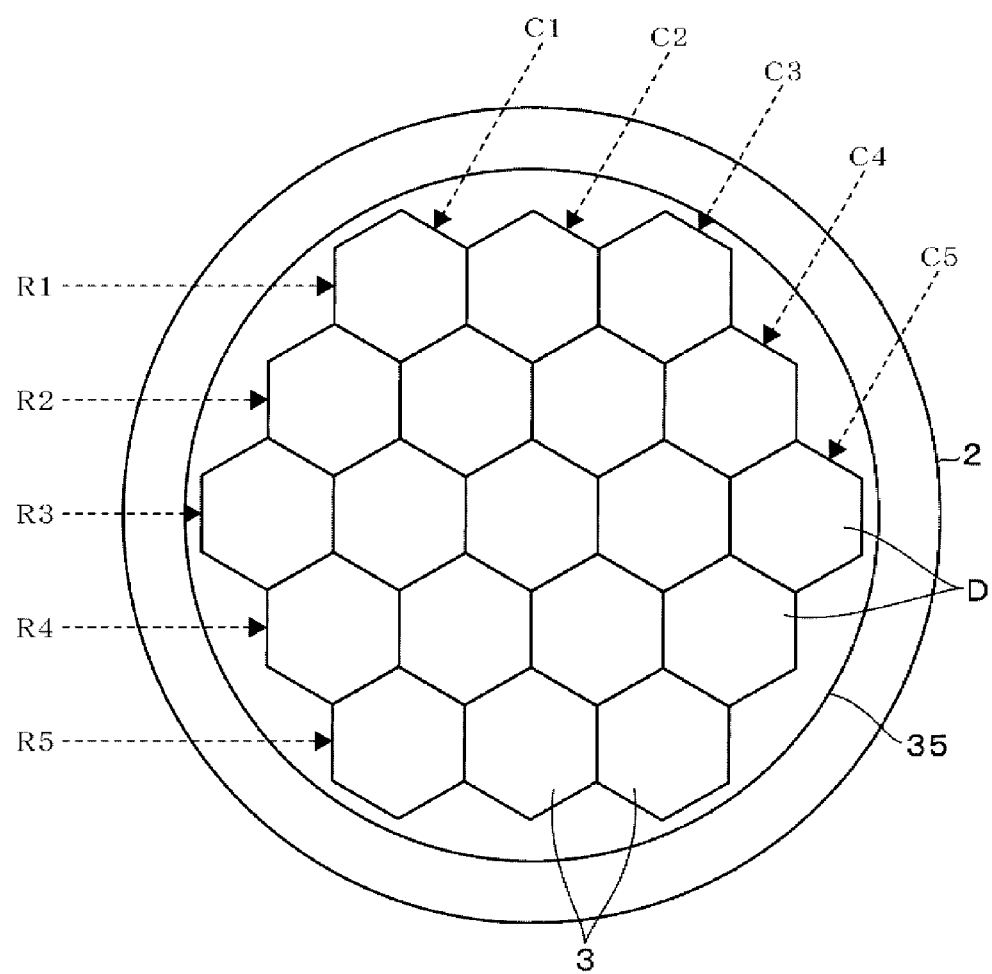
FIG. 12 is a plan view illustrating another example of the stage.

Further, descriptions will be made on another example of a group of the LED units 3 provided on the stage 2. For example, as illustrated in FIG. 12, regular hexagonal areas D may be disposed in a honeycomb shape. Such a configuration in which the regular hexagonal areas D are disposed in a honeycomb shape is also included in a matrix. In this case, in FIG. 12, the directions of the arrows indicated by C1 to C5 may be a column, and the directions of the arrows indicated by R1 to R5 may be a row.

Further, the present disclosure may be applied to a prober that places, for example, the test target chip 100 that is cut off (diced) on a substrate such as a glass substrate in a matrix, and performs a test.

Second Embodiment

Further, the temperature of the area D in which the test target chip 100 is placed may have a temperature gradient due to the temperature of the areas D around the area. As a result, not only the LED unit 3 that heats the location in which the test target chip 100 that is a test target is placed, but also the periphery of the area D in which the test target chip 100 is placed may be heated by heating the areas D disposed to surround the periphery of the area D. Further, when applying the voltage at the time of mounting to the test target chip 100 that is a test target, the temperature of the area D in which the test target chip 100 that is a test target is placed may be adjusted to be equal to the temperature of the peripheral areas D.

When applying the voltage at the time of mounting to the test target chip 100, the thermal load is applied to the area in which the test target chip 100 is placed due to the affection of the heat generation of the test target chip 100, and the thermal load decreases according to the distance from the test target chip 100 (the distance from the center of the area D). Therefore, for example, when the test target chip 100 is placed in the area D49, the second largest thermal load after the area D49 is applied to the areas D38, D48, D50, and D60 adjacent to the area D49 in the row and column directions. Further, the distance from the area D49 to the areas D37, D39, D59, and D61 is longer than the distance from the area D49 to the areas D38, D48, D50, and D60. As a result, the thermal load of the areas D37, D39, D59, and D61 received due to the heat generation of the test target chip 100 becomes lower than that of the areas D38, D48, D50, and D60.

Therefore, when heating the area D in which the test target chip 100 is placed and the areas D surrounding around the area, the heating temperature of the area D49 is lowered, and then the heating temperature of the areas D38, D48, D50, and D60 is set to be low. Further, the areas D37, D39, D59, and D61 are set to the highest set temperature, and thus, the temperatures of the nine areas D may be equal to each other.

Examples of a method of adjusting the temperature of each area may include a method of adjusting the duty ratio by turning on and off the LED unit 3. The method is performed by, when assuming that a time unit that is sufficiently short with respect to the time required for one measurement of the test target chip 100 is referred to as "T1", adjusting the ratio of time (the driving rate of the LED unit) during which the LED unit 3 is driven in the time zone of time T1. The time required for one measurement of the test target chip 100 is a test time when the test target chip 100 is tested one by one or a plurality of test target chips 100 is tested simultaneously.

Figure 13:
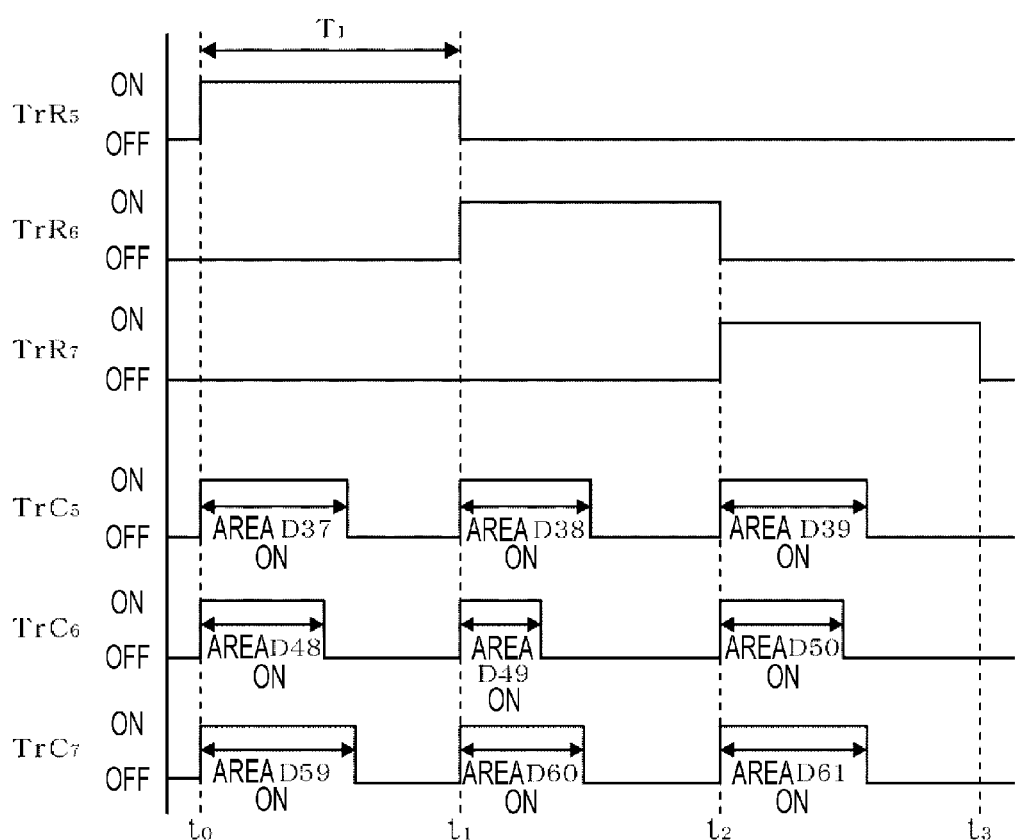
FIG. 13 is a time chart illustrating ON/OFF switching of each transistor in a second embodiment.

FIG. 13 is a time chart correspondingly illustrating, when the test target chip in the area D40 is to be tested, the ON/OFF state of the LED units 3 respectively corresponding to the area D40 and the peripheral areas D37 to D39, D48 to D50, and D59 to D61 surrounding the area D40, and the ON/OFF state of the transistors TrC5 to TrC7 and TrR5 to TrR7 for driving the LED units 3. The driving ratio of the LED units 3 may be set to, for example, 30% for the area D49, 50% for the areas D48, D38, D50, and D60, and 60% for the areas D37, D39, D59, and D61.

In this case, the transistors TrR5, TrR6, and TrR7 are turned on in order from t0 to t3 for each time zone of the continuous time T1. Further, the transistors TrC5, TrC6, and TrC7 are turned on by the time ratio corresponding to the driving ration of the LED units 3 in the area to be turned on, for each unit time T1. For example, for the LED unit 37 in the area D37, the transistor TrR5 is kept to be turned on, and the transistor TrC5 is turned on in the ratio of 65% in the time zone of the unit time T1. The value of the ratio is an example, and does not restrict the value in the present disclosure.

The combinations of ON and OFF of the respective transistors TrR and TrC are determined by code data which is a digital signal sent from the data processor 73 to the row controller 75 and the column controller 74. As a result, the method described above may be achieved by recording the time series data of the code data in the memory of the data processor 73 such that the combinations of ON and OFF of the respective transistors TrR and TrC become, for example, the time chart defined in FIG. 13.

Figure 14:
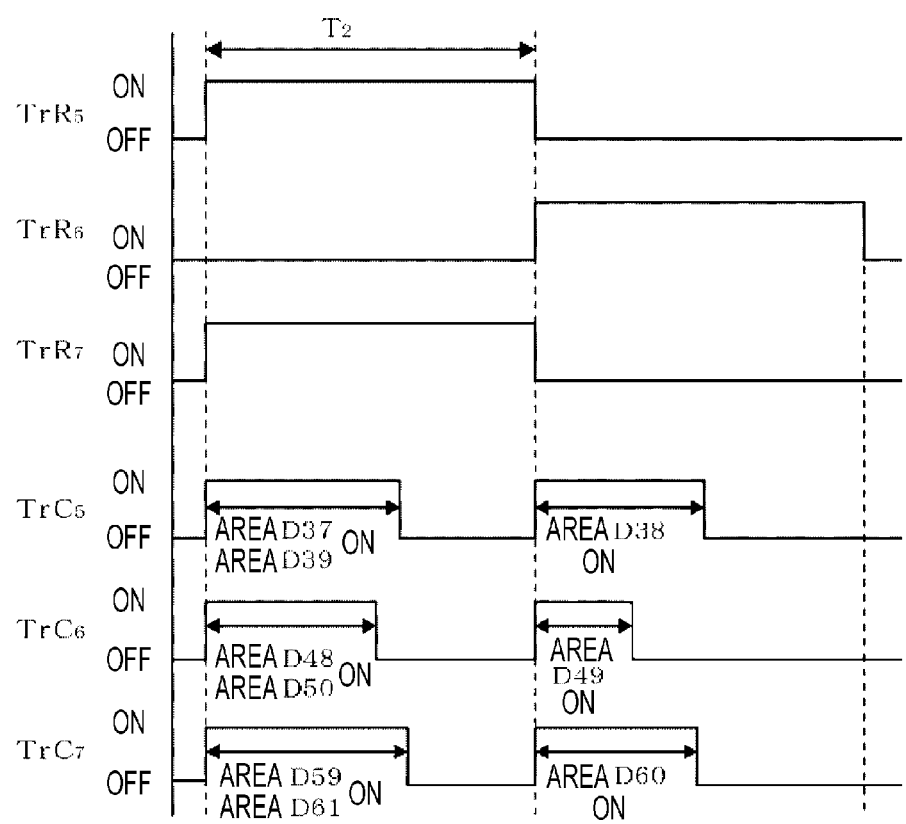
FIG. 14 is a time chart illustrating another example of ON/OFF switching of each transistor.

Further, another example of the time chart illustrating ON/OFF of the respective transistors in a second embodiment will be described. As illustrated in FIG. 14, in the example, when the transistors TrR5 and TrR7 are turned on in the time zone of the unit time T2, the transistors TrC5, TrC6, and TrC7 are turned on by the ratio of time corresponding to the driving ratio of the LED unit 3 in the area to be turned on. Thereafter, when the transistor TrR6 is turned on, the transistors TrC5, TrC6, and TrC7 are turned on by the ratio of time corresponding to the driving ratio of the LED unit 3 in the area to be turned on. In this case as well, the same temperature distribution as in the example illustrated in FIG. 13 may be formed.

In the example, a processing in which the LED units 3 in the three areas D of the row R5 and the three areas D of the row R7 and a processing in which the LED units in the three areas D of the row R6 will be alternately repeated. In the example, light may be simultaneously irradiated from the LED units 3 in the areas D37 and D39, the areas D48 and D50, and the areas D59 and D61, respectively. Therefore, since it is possible to increase the temperatures of many areas D at the same time, the time required to reach the target temperature may be shortened.

Further, a mode in which the LED unit 3 is driven in order among three transistor TrR units and a mode in which the LED unit 3 is driven in order among three transistor TrC units may be alternately executed.

Figure 15:
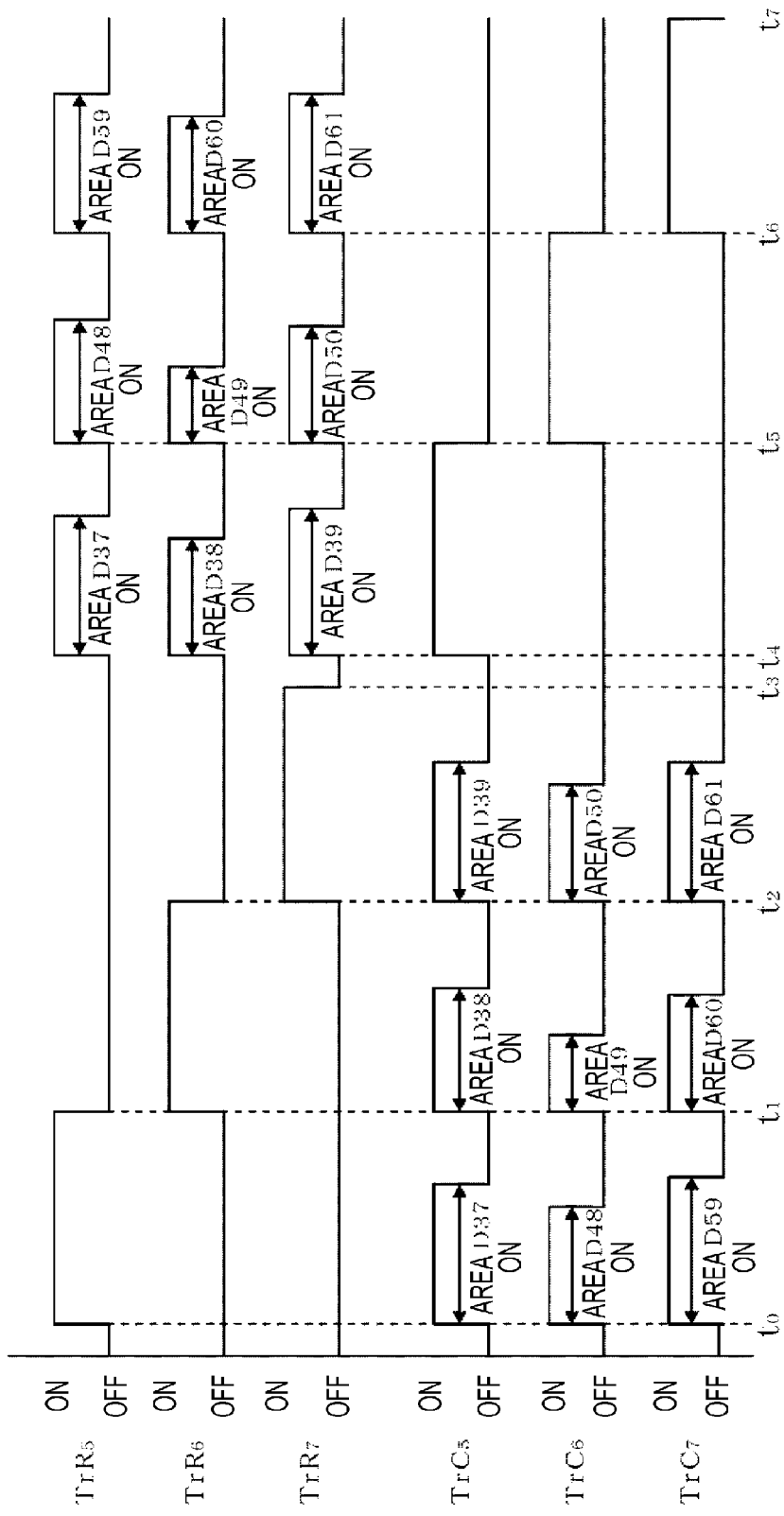
FIG. 15 is a time chart illustrating yet another example of ON/OFF switching of each transistor.

For example, as illustrated in a time chart in FIG. 15, from time t0 to time t3, the processing is performed in the same manner as the example of the time chart illustrated in FIG. 13. Subsequently, from time t4 to time t7, the transistor TrC5 is turned on, and the transistors TrR5, TrR6, and TrR7 are turned on. Further, from time t5, the transistor TrC6 is turned on, and the transistors TrR5, TrR6, and TrR7 are turned on, and then, from time t6, the transistor TrC7 is turned on, and the transistors TrR5, TrR6, and TrR7 are turned on.

With the configuration, the LED units 3 in the three areas D of the transistor TrR5, the LED units 3 in the three areas D of the transistor TrR6, and the LED units 3 in the three areas D of the transistor TrR7 are turned on in the order from time t0 to time t3. Further, the LED units 3 in the three areas D of the transistor TrC5, the LED units 3 in the three areas D of the transistor TrC6, and the LED units 3 in the three areas D of the transistor TrC7 are turned on in the order from time t4 to time t7.

Also with the configuration, the LED unit 3 in each area D may be turned on for a predetermined time, respectively. Therefore, since each area D may be heated to a predetermined temperature, respectively, the same effect may be obtained.

Further, in the second embodiment, an example in which nine areas D are heated has been described, but, for example, the present disclosure may be applied to a case in which, for example, areas D of four rows*four columns or more are heated.

Further, the above-described embodiment, the LED units 3 corresponding to the nine areas D including the area D49 are driven, and the LED units 3 in the areas D other than the nine areas D are turned off. However, in the present disclosure, a case in which the LED unit 3 in other area D is driven with a low light emission amount that does not affect to the test of the test target chip under the test is also included in the technical scope of the present disclosure, and such implementation is an infringement of the language of the claims.

Figure 16:
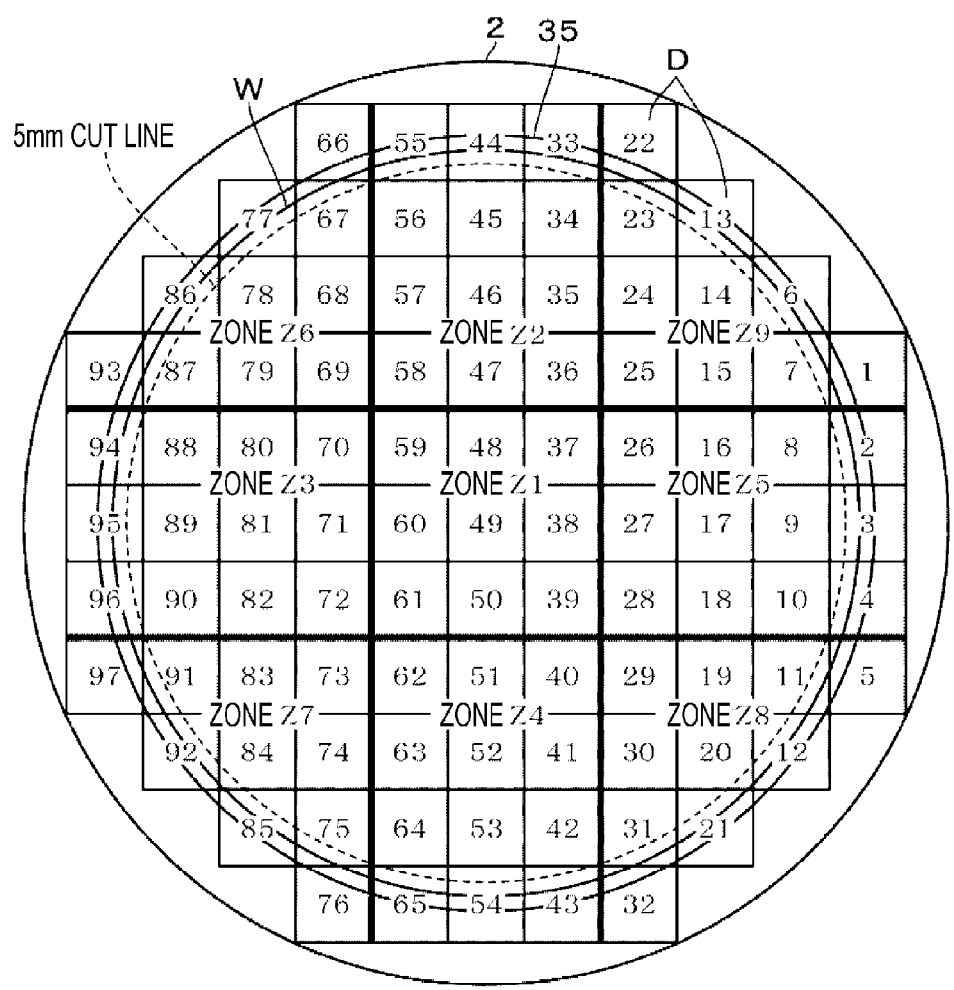
FIG. 16 is a plan view of a stage according to another example of the embodiment according to the present disclosure.
Figure 17:
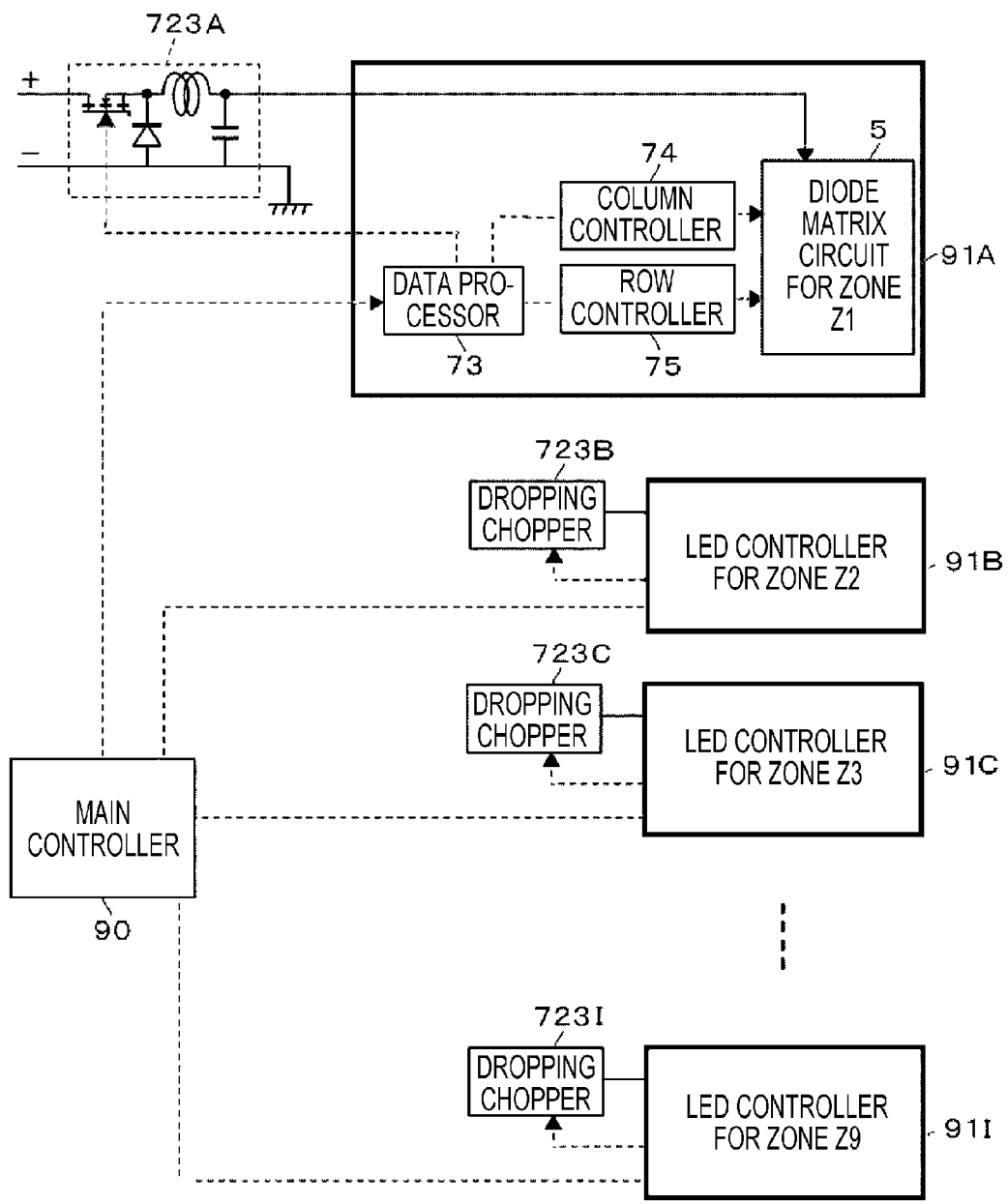
FIG. 17 is a circuit diagram illustrating a circuit configured to individually turn on LED units.

Further, in the present disclosure, the placing surface may be divided into several zones Z constituted by a plurality of areas D, and the diode matrix circuit 5 may be configured for each zone Z, and each zone Z may be controlled by the LED controller 91. For example, as illustrated in FIG. 16, the area D of the stage 2 illustrated in FIG. 3 is divided into nine vertical and horizontal zones Z1 to Z9. Further, as illustrated in FIG. 17, for each zone Z1 to Z9, the diode matrix circuit 5 corresponding to the plurality of areas D disposed in a grid pattern arranged in the zones Z1 to Z9 in the row and column directions is configured, and LED controllers 91A to 91I driving each diode matrix circuit 5 respectively are configured. Further, dropping chopper circuits 723A to 723I corresponding to the respective zones Z1 to Z9 are provided in the respective zones Z1 to Z9, respectively. As already described, the components of the driving circuit of the data processor 73, the column controller 74, the row controller 75, and the diode matrix circuit 5 correspond to the LED controller 91A to 91I. However, in FIG. 17, the diode matrix circuit 5 including the LED unit 3 is illustrated for convenience.

With the configuration, the driving power of the diode matrix circuit 5 may be adjusted by the dropping chopper circuits 723A to 723I provided in the respective zones Z1 to Z9, respectively, and the output may be adjusted for the respective zones Z1 to Z9. With the configuration, for example, even when the entire surface of the wafer W is heated, it is possible to adjust the heating temperature by adjusting the output values for the respective zones Z1 to Z9.

Further, since the diode matrix circuit 5 and the LED controllers 91A to 91I are provided for each of the zones Z1 to Z9, it is possible to independently control the area D assigned to the respective zones Z1 to Z9 for each of the zones Z1 to Z9.

DESCRIPTION OF SYMBOLS

2: stage
3: LED unit
5: diode matrix circuit
7: power supply
8: temperature detector
9: controller
32: cooling unit
73: data processor
74: column controller
75: row controller
100: test target chip (IC chip)
101: electrode pad
W: wafer

What is claimed is:

1. A prober comprising:
a stage configured to place thereon a substrate formed with a plurality of chips provided in a matrix;
a contact configured to sequentially contact with electrode pads of the plurality of chips, thereby performing an inspection on electrical characteristics of the plurality of chips to be inspected;
a plurality of LED units provided on a side opposite to a placing surface of the stage so as to independently heat a plurality of areas where the plurality of chips are located, respectively, and each including one or a plurality of LEDs; and
a controller configured to output a control signal to drive, among the plurality of LED units, at least an LED unit corresponding to an area of a chip to be inspected, among the area of the chip to be inspected and peripheral areas of the corresponding area.

2. The prober according to claim 1, wherein a diode matrix circuit is configured by the plurality of LED units.

3. The prober according to claim 1, wherein the controller outputs a control signal to drive LED units corresponding to the area of the chip to be inspected and the peripheral areas of the corresponding area, and to increase light emission intensity of LED units corresponding to the peripheral areas to be larger than light emission intensity of the LED unit corresponding to the area of the chip to be inspected.

4. The prober according to claim 1, wherein LED units to be turned on during the inspection are grouped in at least one of a row unit and a column unit of the LED units, and
the controller outputs a control signal to drive the grouped LED units in a time-division manner.

5. The prober according to claim 4, wherein the controller outputs a control signal to drive the LED units while switching the row unit and the column unit during the inspection.

6. The prober according to claim 4, wherein the controller outputs a control signal to drive the LED units to be turned on during the inspection and the LED unit groups adjacent to the LED units and surrounding the LED units sequentially in row units or sequentially in column units.

7. The prober according to claim 4, wherein the controller outputs a control signal to drive the LED units to be turned on during the inspection and the LED unit groups adjacent to the LED units and surrounding the LED units alternately in a mode in which a row unit including the chip to be inspected is driven and a mode in which row units on both sides of the row unit are simultaneously driven, or alternately in a mode in which a column unit including the chip to be inspected is driven and a mode in which column units on both sides of the column unit are simultaneously driven.

8. The prober according to claim 5, wherein the controller outputs a control signal to drive the LED units to be turned on during the inspection and the LED unit groups adjacent to the LED units and surrounding the LED units alternately in a mode in which the LED units are driven sequentially in row units and a mode in which the LED units are driven sequentially in column units.

* * * * *